US009453878B2

(12) United States Patent
Campi, Jr. et al.

(10) Patent No.: US 9,453,878 B2
(45) Date of Patent: Sep. 27, 2016

(54) CHARACTERIZATION OF INTERFACE RESISTANCE IN A MULTI-LAYER CONDUCTIVE STRUCTURE

(71) Applicant: International Business Machines Corporation, Armonk, NY (US)

(72) Inventors: John B. Campi, Jr., Westford, VT (US); Robert J. Gauthier, Jr., Hinesburg, VT (US); Junjun Li, Williston, VT (US); Souvick Mitra, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 815 days.

(21) Appl. No.: 13/776,902

(22) Filed: Feb. 26, 2013

(65) Prior Publication Data

US 2014/0244202 A1     Aug. 28, 2014

(51) Int. Cl.
    *G01R 31/28*                 (2006.01)

(52) U.S. Cl.
    CPC ................................ *G01R 31/2884* (2013.01)

(58) Field of Classification Search
None
See application file for complete search history.

(56) References Cited

U.S. PATENT DOCUMENTS

| | | | |
|---|---|---|---|
| 3,388,457 A | 6/1968 | Totta | |
| 4,638,341 A | 1/1987 | Baier et al. | |
| 5,699,282 A * | 12/1997 | Allen | G01R 31/2818 324/699 |
| 6,319,808 B1 | 11/2001 | Ho et al. | |
| 6,600,333 B1 * | 7/2003 | Martin | G01R 31/2884 324/679 |
| 6,716,653 B2 * | 4/2004 | Look | G01B 7/003 438/14 |
| 7,061,256 B2 | 6/2006 | Hasegawa | |
| 7,982,457 B2 | 7/2011 | Redko et al. | |

OTHER PUBLICATIONS

Gutai, "Transmission Line Model Test Structure With Four or More Terminals," Proceedings of IEEE 1990 International Conference on Microelectronic Test Structures, vol. 3, Mar. 1990, pp. 21-25.

Reeves, et al., "An Analytical Model for Alloyed Ohmic Contacts Using a Trilayer Transmission Line Model," IEEE Transactions on Electron Devices, vol. 42, No. 8, Aug. 1995, pp. 1536-1547.

(Continued)

*Primary Examiner* — Paresh Patel
(74) *Attorney, Agent, or Firm* — Gibb & Riley, LLC; Anthony J. Canale

(57) ABSTRACT

Disclosed is a test structure that can be used to characterize a specific interface resistance within a multi-layer conductive structure, such as a multi-layer ohmic contact. In the test structure first and second transmission line model (TLM) structures both incorporate a row of essentially identical contact pads separated by spaces with progressively increasing lengths. Conductive mesas, also with progressively increasing lengths, are positioned within the spaces between all but the initial pair of adjacent contacts pads. The first and second TLM structures differ only with respect to the presence of a single conductive layer on each of the conductive mesas. System, method and computer program product embodiments are able to extract resistance parameters associated with the first and second TLM structures, including conductive mesa to conductive layer interface resistances, based current-voltage measurements acquired from both of the TLM structures.

25 Claims, 7 Drawing Sheets

(56) References Cited

OTHER PUBLICATIONS

Sawdai, et al., "Enhanced Transmission Line Model Structures for Accurate Resistance Evaluation of Small-Size Contacts and for More Reliable Fabrication," IEEE Transactions on Electron Devices, vol. 46, No. 7, Jul. 1999, pp. 1302-1311.

Chor, et al., "Quasi-Two-Dimensional Transmission Line Model (QTD-TLM) for Planar Ohmic Contact Studies," IEEE Transactions on Electron Devices, vol. 49, No. 1, Jan. 2002, pp. 105-111.

Stavitski, et al., "Evaluation of Transmission Line Model Structures for Silicide-to-Silicon Specific Contact Resistance Extraction," IEEE Transactions on Electron Devices, vol. 55, No. 5, May 2008, pp. 1170-1176.

Stavitski, et al., "Cross-Bridge Kelvin Resistor Structures for Reliable Measurement of Low Contact Resistances and Contact Interface Characterization," IEEEE Transactions on Semiconductor Manufacturing, vol. 22, No. 1, Feb. 2009, pp. 146-152.

\* cited by examiner

CHARACTERIZATION OF INTERFACE RESISTANCE IN A MULTI-LAYER CONDUCTIVE STRUCTURE

BACKGROUND

The embodiments disclosed herein relate to characterizing parasitic resistances in integrated circuits and, more particularly, to embodiments of a test structure as well as a system, a method and a computer program product for characterizing interface resistance in a multi-layer conductive structure, such as a multi-layer ohmic contact.

Parasitic contact resistance is one of the larger parasitic resistances that will impact the performance of very large scale integration (VLSI) circuits, such as ring oscillators, logic gates (e.g., NAND gates, NOR gates, etc.), etc. Thus, accurate characterization of parasitic contact resistance is very important in integrated circuit design. Traditionally, contact resistance is characterized based on current-voltage measurements acquired from a test structure comprising a transmission line model (TLM) structure formed on a semiconductor substrate. However, this characterization does not uniquely characterize the resistance of individual layers within a multi-layer contact, nor does it characterize the interface resistance between such layers.

SUMMARY

In view of the foregoing, disclosed herein are embodiments of a test structure as well as embodiments of a system, method, and computer program product that acquire current-voltage measurements from this unique test structure in order to characterize a specific interface resistance within a multi-layer conductive structure, such as a multi-layer ohmic contact. The test structure embodiments incorporate a first transmission line model (TLM) structure and a second TLM structure. The first and second TLM structures both incorporate a row of essentially identical contact pads separated by spaces with progressively increasing lengths. Conductive mesas, also with progressively increasing lengths, are positioned within the spaces between all but the initial pair of adjacent contacts pads. The first and second TLM structures differ only with respect to the presence of a single conductive layer on each of the conductive mesas and, thereby the resulting conductive mesa to conductive layer interfaces. The system, method and computer program product embodiments are able to extract resistance parameters associated with the first and second TLM structures, including conductive mesa to conductive layer interface resistances, based on first current-voltage measurements acquired from the first TLM structure and second current-voltage measurements acquired from the second TLM structure.

More particularly, disclosed herein are embodiments of a test structure. This test structure can comprise a semiconductor substrate and two transmission line model (TLM) structures (i.e., a first TLM structure and a second TLM structure) on the semiconductor substrate. These two TLM structures can each comprise a row of essentially identical contact pads. The row of contact pads within each TLM structure can comprise an initial contact pad and a group of additional contact pads adjacent to the initial contact pad. The initial contact pad can be separated from the group by an initial space having a first length and, within the group of additional contact pads, adjacent pairs of additional contact pads can be separated by additional spaces having progressively increasing second lengths that are greater than the first length of the initial space. These two TLM structures can also each comprise conductive mesas within the additional spaces between adjacent pairs of additional contacts. These conductive mesas can be made of the same material, can be centered within the additional spaces and can have progressively increasing third lengths. The second TLM structure only can further comprise a conductive layer covering the top surface of each of the conductive mesas within the additional spaces in its row of contact pads. Thus, the first and second TLM structures within the test structure differ only with respect to the presence of the conductive layer covering each conductive mesa and the resulting conductive mesa to conductive layer interfaces (which also have the progressively increasing third lengths).

Also disclosed herein are embodiments of a system that incorporates the above-described test structure for characterizing resistance and, particularly, for characterizing a specific interface resistance within a multi-layer conductive structure, such as a multi-layer ohmic contact. The system can comprise a test structure, as described in detail above, comprising a semiconductor substrate and two transmission line model (TLM) structures (i.e., a first TLM structure and a second TLM structure) on the semiconductor substrate and differing only with respect to the presence of the conductive layer covering each conductive mesa and the resulting conductive mesa to conductive layer interfaces. The system can further comprise a probing station that acquires first current-voltage measurements from the row of contact pads in the first TLM structure and second current-voltage measurements from the row of contact pads in the second TLM structure.

The system can further comprise a processor that receives the first current-voltage measurements and the second current-voltage measurements (e.g., either communicated directly from the probing station or accessed from memory) and characterizes a specific conductive mesa to conductive layer interface resistance associated with a specific conductive mesa within a specific additional space in the second TLM structure based on the first current-voltage measurements and the second current-voltage measurements. For example, to characterize the specific conductive mesa to conductive layer interface resistance, the processor can extract a first set of resistance parameters associated with the first TLM structure based on the first current-voltage measurements. Then, the processor can extract a second set of resistance parameters associated with the second TLM structure including, but not limited to the specific conductive mesa to conductive layer interface resistance, based on both the second current-voltage measurements and the first set of resistance parameters.

It should be noted that the processor can further characterize conductive mesa to conductive layer interface resistances associated with all of the conductive mesas in all of the additional spaces in the second TLM structure based on the first current-voltage measurements and the second current-voltage measurements, in the same manner as described above, such that the resistance characterizations account for each of the progressively increasing third lengths. Thus, the system is able to use the same test structure to characterize resistance of the same conductive mesa to conductive layer interface at different lengths.

Also disclosed herein are embodiments of an associated method that incorporates the above-described test structure for characterizing resistance and, particularly, for characterizing a specific interface resistance within a multi-layer conductive structure, such as a multi-layer ohmic contact. The method can comprise forming a test structure, as described in detail above, comprising a semiconductor substrate and two transmission line model (TLM) structures (i.e., a first TLM structure and a second TLM structure) on the semiconductor substrate and differing only with respect to the presence of the conductive layer covering each conductive mesa and the resulting conductive mesa to conductive layer interfaces.

The method can further comprise, using a probing station, to acquire first current-voltage measurements from the row of contact pads in the first TLM structure and second current-voltage measurements from the row of contact pads in the second TLM structure.

Next, the method can comprise receiving, by a processor, the first current-voltage measurements and the second current-voltage measurements (e.g., either communicated directly from the probing station or accessed from memory) and characterizing, by the processor, a specific conductive mesa to conductive layer interface resistance associated with a specific conductive mesa within a specific additional space in the second TLM structure based on the first current-voltage measurements and the second current-voltage measurements. For example, the process of characterizing the specific conductive mesa to conductive layer interface resistance can comprise extracting a first set of resistance parameters associated with the first transmission line model structure based on the first current-voltage measurements. Then, the processor can extract a second set of resistance parameters associated with the second transmission line model structure including, but not limited to the specific conductive mesa to conductive layer interface resistance, based on both the second current-voltage measurements and the first set of resistance parameters.

It should be noted that the characterizing process can be iteratively repeated in order to characterize the conductive mesa to conductive layer interface resistances associated with all of the conductive mesas in all of the additional spaces in the second TLM structure based on the first current-voltage measurements and the second current-voltage measurements such that the resulting resistance characterizations account for each of the progressively increasing third lengths. Thus, the method is able to use the same test structure to characterize resistance of the same conductive mesa to conductive layer interface at different lengths.

Also disclosed herein are embodiments of a computer program product. This computer program product can comprise a tangible computer readable storage device. The tangible computer readable storage device can store program code that is executable by a computer to perform the above-described method for characterizing resistance and, particularly, for characterizing a specific interface resistance within a multi-layer conductive structure, such as a multi-layer ohmic contact.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, parasitic contact resistance is one of the larger parasitic resistances that will impact the performance of very large scale integration (VLSI) circuits, such as ring oscillators, logic gates (e.g., NAND gates, NOR gates, etc.), etc. Thus, accurate characterization of parasitic contact resistance is very important in integrated circuit design.

Figure 1:
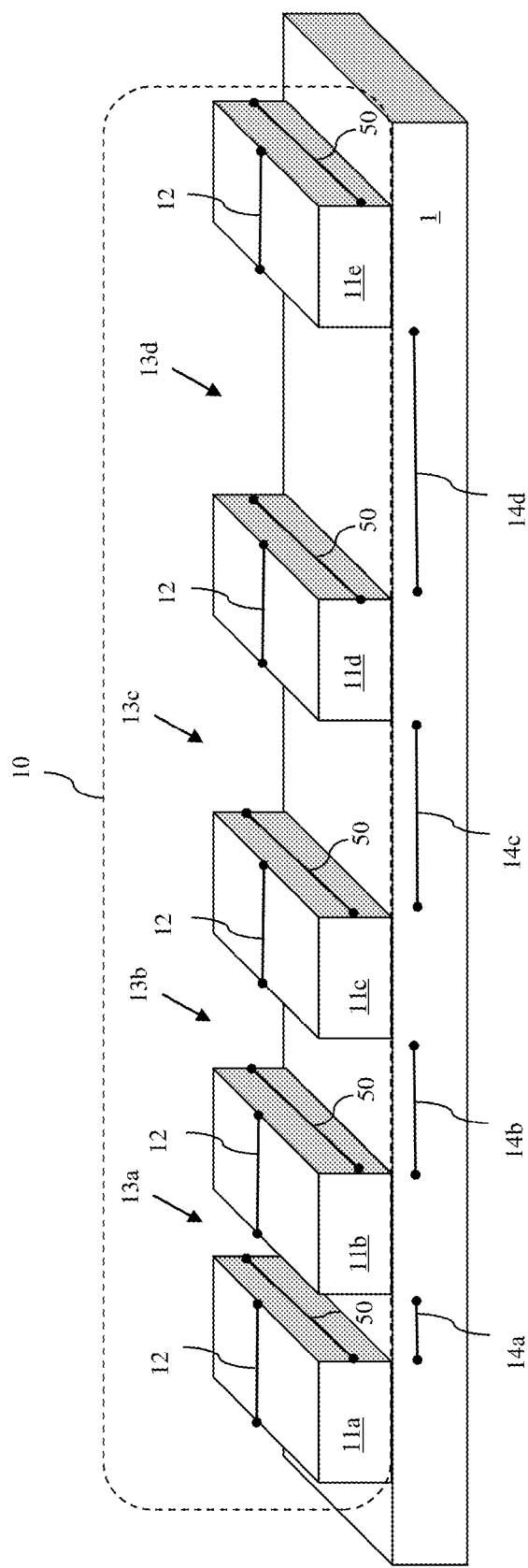
FIG. 1 is a perspective drawing illustrating a traditional transmission line model (TLM) structure.

Traditionally, contact resistance is characterized based on current-voltage measurements acquired from test structure comprising a transmission line model (TLM) structure formed on a semiconductor substrate. FIG. 1 is a perspective drawing illustrating a traditional TLM structure 10. In this TLM structure 10, a row of contacts pads (i.e., patterned conductors) is formed on a semiconductor substrate 1. For illustration purposes, five contact pads 11a-e are shown within the row. However, those skilled in the art will recognize that any number of three or more contact pads could be used. The contact pads 11a-e are essentially identical in that they are formed of the same conductive material and are the same size (i.e., have the same length 12 and width 50). However, the spaces separating each pair of adjacent contact pads have progressively increasing lengths. That is, the space 13a between contact pads 11a and 11b has a length 14a, the space 13b between contact pads 11b and 11c has a length 14b that is greater than length 14a, the space 13c between contact pads 11c and 11d has a length 14c that is greater than length 14b and the space 13d between contact pads 11d and 11e has a length 14d that is greater than length 14c.

During test, the semiconductor substrate 1 is passed through a probing station (not shown) where current-voltage measurements are taken from each pair of adjacent contact pads (e.g., from contact pads 11a and 11b, from contact pads 11b and 11c, from contact pads 11c and 11d and from contact pads 11d and 11e). Specifically, at each pair of adjacent contact pads, current I is forced into a first contact pad in the pair. Then, a first voltage $V_1$ is measured at the first contact pad and a second voltage $V_2$ is measured at the second contact pad. Typically, the current I is also measured at the second contact pad for verification. A processor (not shown) can then calculate the total resistance $R_T$ between each pair of adjacent contact pads as being equal to the difference between the two measured voltages $V_1$, and $V_2$ divided by the current I (i.e., $R_T=(V_1-V_2)/I$). For any given pair of adjacent contact pads, this total resistance $R_T$ will also be equal to the series combination of three resistance values: the contact resistance $R_{C1}$ associated with a first contact pad in the pair of adjacent contact pads at issue, the substrate resistance $R_S$ across the space between the pair of adjacent contact pads at issue, and the contact resistance $R_{C2}$ associated with a second contact pad in the pair of adjacent contact pads at issue. The substrate resistance $R_S$ will be equal to the substrate sheet resistance $R_{sh}$ times the ratio between the length and width of the space between the space between the pair of adjacent contact pads at issue. For example, for the pair of adjacent contact pads 11a and 11b, the substrate resistance $R_S$ will be equal to the substrate sheet resistance $R_{sh}$ times the length 14a of the space 13a divided by the width 50; for the pair of adjacent contact pads 11b and 11c, the substrate resistance $R_S$ will be equal to the substrate sheet resistance $R_{sh}$ times the length 14b of the space 13b and divided by width 50; and so on. Since the contact pads in the pair are identical, their resistances will be identical (i.e., $R_{C1}=R_{C2}$) and, thus, $R_T=2R_C+R_S$. Consequently, the current-voltage measurements, which as discussed above are acquired from the multiple pairs of adjacent contact pads separated by spaces having progressively increasing lengths within the TLM structure, can be used to determine the contact resistance $R_C$ of any one of the contact pads because in the limit where the length of the space between the contact pads approaches zero, the substrate resistance $R_S$ also approaches 0 so that the contact resistance $R_C$ will be equal to the total resistance $R_T$ divided by 2 (i.e., $R_C$, $R_T/2$). The process is then repeated for a family of TLM structures of various contact lengths, d, and the effective interface resistance, $\rho_c$, is extracted through non-linear fitting methods according to the $\rho_c=R_{sk}*L_T/W*\coth(d/L_T)$, where $R_{sk}$ is the sheet resistance under the contact ($R_{sk} \neq R_{sh}$), where W is the width of the contact, where $L_T$ represents a semiconductor substrate to contact interface transfer length, and where $L_T=\sqrt{\rho_c/R_{sk}}$.

Unfortunately, this traditional TLM structure is not adequate for characterizing the resistance of component layers in a multi-layered contact. More specifically, the contact pads 11a-e in this traditional TLM structure of FIG. 1 are fully processed contact pads (i.e., they reflect the complete structure of the contact being characterized); therefore, there is no way to isolate resistance parameters associated with any particular layer in the that contact, when the contact incorporates multiple conductive layers. That is, this traditional TLM structure of FIG. 1 cannot be used to uniquely characterize the resistances of more than two component layers of a multi-layer contact or the interface resistance between them. Thus, when using the traditional TLM structure 1 to characterize the resistance of a multi-layer contact, the contact resistance $R_C$ found is, in effect, an average resistance associated with all of the component layers of the multi-layer contact. Higher order models cannot be extracted from a traditional TLM structure without assumptions about sub-layer parameter values, which lead to inaccurate conclusions about extracted parameters.

In view of the foregoing, disclosed herein are embodiments of a test structure as well as embodiments of a system, method, and computer program product that acquire current-voltage measurements from this unique test structure in order to characterize a specific interface resistance within a multi-layer conductive structure, such as a multi-layer ohmic contact. The test structure embodiments incorporate a first transmission line model (TLM) structure and a second TLM structure. The first and second TLM structures both incorporate a row of essentially identical contact pads separated by spaces with progressively increasing lengths. Conductive mesas, also with progressively increasing lengths, are positioned within the spaces between all but the initial pair of adjacent contacts pads. The first and second TLM structures differ only with respect to the presence of a single conductive layer on each of the conductive mesas and, thereby the resulting conductive mesa to conductive layer interfaces. The system, method and computer program product embodiments are able to extract resistance parameters associated with the first and second TLM structures, including conductive mesa to conductive layer interface resistances, based on first current-voltage measurements acquired from the first TLM structure and second current-voltage measurements acquired from the second TLM structure.

Figure 2:
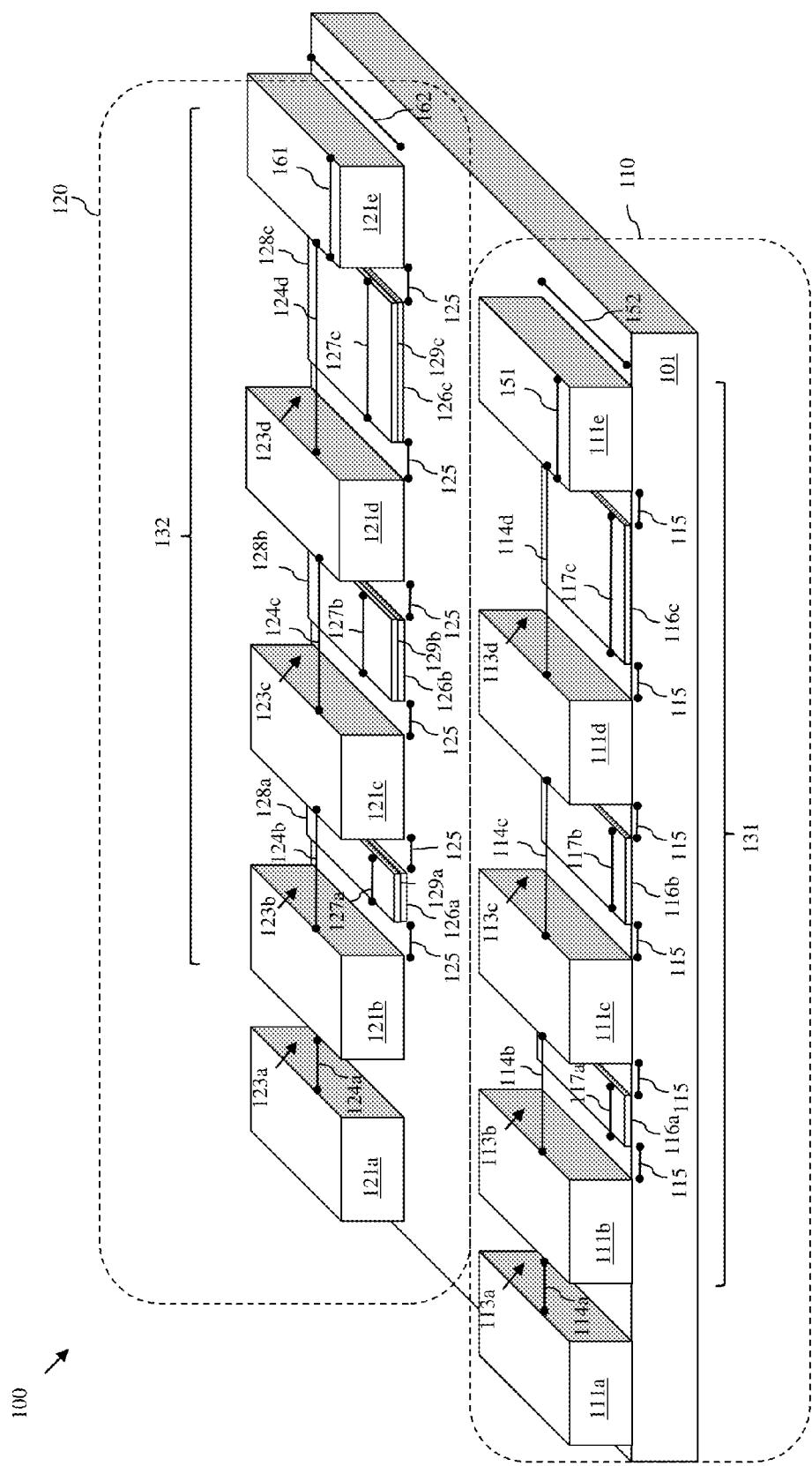
FIG. 2 is a perspective drawing illustrating an embodiment of a test structure comprising a first TLM structure and a second TLM structure.

More particularly, referring to FIG. 2, disclosed herein are embodiments of a test structure 100. This test structure 100 can comprise a semiconductor substrate 101 (e.g., a silicon substrate, a silicon germanium substrate, or any other suitable semiconductor substrate). The semiconductor substrate can be either monocrystalline or polycrystalline in structure. The test structure 100 can further comprise two transmission line model (TLM) structures on the semiconductor substrate 101 (i.e., a first TLM structure 110 associated with a 2-layer model and a second TLM structure 120 associated with a 3-layer model).

The first TLM structure 110 and the second TLM structure 120 can each comprise a row of contact pads 111a-e, 121a-e (i.e., patterned conductors). For illustration purposes, the first TLM structure 110 and the second TLM structure 120 are each shown as having five contact pads. However, it is anticipated that these TLM structures 110, 120 can have the same number of three or more contacts pads. In any case, all of the contacts pads in the test structure 100 (e.g., the contact pads 111a-e within the first TLM structure 110 and the contact pads 121a-e in the second TLM structure 120) can be essentially identically. That is, the contact pads 111a-e and 121a-e can be the same size in terms of length, width and height. For example, first contact pads 111a-e can each have the same first length 151, the same first width 152 and the same first height that are equal respectively equal to the second length 161, second width 162 and second height of the second contact pads 121a-e. The contact pads 111a-e and 121a-e can also all be made of the same conductive material(s) (e.g., one or more layers of doped semiconductor material, silicide material and/or metal or metal alloy material).

Each row of contact pads (i.e., the row of contact pads 111a-e within the first TLM structure 110 and the row of contact pads 121a-e in the second TLM structure 120) can comprise an initial contact pad and a group of additional contact pads adjacent to the initial contact pad. The initial contact pad can be separated from the group by an initial space having a first length and, within the group of additional contact pads, adjacent pairs of additional contact pads can be separated by additional spaces having progressively increasing second lengths that are greater than the first length of the initial space. Specifically, the row of contact pads 111a-e within the first TLM structure 110 can comprise an initial contact pad 111a and a group 131 of additional contact pads 111b-111e adjacent to the initial contact pad 111a. The initial contact pad 111a can be separated from the group 131 by an initial space 113a having a first length 114a and, within the group 131 of additional contact pads 111b-111e, adjacent pairs of additional contact pads can be separated by additional spaces 113b-113d having progressively increasing second lengths 114b-d, respectively, that are greater than the first length 114a of the initial space 113a. That is, the adjacent pair of additional contact pads 111b and 111c can be separated by an additional space 113b having a second length 114b that is greater than the first length 114a of the initial space 113a, the adjacent pair of additional contact pads 111c and 111d can be separated by an additional space 113c having a second length 114c that is greater than the second length 114b between the adjacent pair of additional contact pads 111b and 111c; and the adjacent pair of additional contact pads 111d and 111e can be separated by an additional space 113d having a second length 114d that is greater than the second length 114c between the adjacent pair of additional contact pads 111c and 111d.

Furthermore, the row of contact pads 121a-e within the second TLM structure 120 can comprise an initial contact pad 121a and a group 132 of additional contact pads 121b-121e adjacent to the initial contact pad 121a. The initial contact pad 121a can be separated from the group 132 by an initial space 123a having a first length 124a and, within the group 132 of additional contact pads 121b-121e, adjacent pairs of additional contact pads can be separated by additional spaces 123b-123d having progressively increasing second lengths 124b-d, respectively, that are greater than the first length 124a of the initial space 123a. That is, the adjacent pair of additional contact pads 121b and 121c can be separated by an additional space 123b having a second length 124b that is greater than the first length 124a of the initial space 123a, the adjacent pair of additional contact pads 121c and 111d can be separated by an additional space 123c having a second length 124c that is greater than the second length 124b between the adjacent pair of additional contact pads 121b and 121c; and the adjacent pair of additional contact pads 121d and 121e can be separated by an additional space 123d having a second length 124d that is greater than the second length 124c between the adjacent pair of additional contact pads 121c and 121d.

It should be noted that any given space between adjacent contact pads in the first TLM structure 110 will have the same length as the corresponding space between adjacent contact pads in the second TLM structure 120. That is, the first length 114a of the initial space 113a in the first TLM structure 110 will be the same as the corresponding first length 124a of the corresponding initial space 123a in the second TLM structure 120; the second length 114b of the additional space 113b in the first TLM structure 110 will be the same as the corresponding second length 124b of the corresponding additional space 123b in the second TLM structure 120; the second length 114c of the additional space 113c in the first TLM structure 110 will be the same as the corresponding second length 124c of the corresponding additional space 123b in the second TLM structure 120; and the second length 114d of the additional space 113d in the first TLM structure 110 will be the same as the corresponding second length 124d of the corresponding additional space 123d in the second TLM structure 120.

The first TLM structure 110 and the second TLM structure 120 can also each comprise conductive mesas centered within the additional spaces between adjacent pairs of additional contacts. Specifically, the first TLM structure 110 can comprise a conductive mesa 116a centered within the additional space 113b between the pair of adjacent contacts 111b and 111c, a conductive mesa 116b centered within the additional space 113c between the pair of adjacent contacts 111c and 111d, and a conductive mesa 116c centered within the additional space 113d between the pair of adjacent contacts 111d and 111e. Furthermore, the second TLM structure 120 can comprise a conductive mesa 126a centered within the additional space 123b between the pair of adjacent contacts 121b and 121c, a conductive mesa 126b centered within the additional space 123c between the pair of adjacent contacts 121c and 121d, and a conductive mesa 126c centered within the additional space 123d between the pair of adjacent contacts 121d and 121e.

All of the conductive mesas 116a-c and 126a-c in the test structure 100 will have the same width. That is, all of the conductive mesas 116a-c within the first TLM structure 110 will have the same first width 152 as the first contact pads 111a and all of the conductive mesas 126a-c in the second TLM structure 120 will have the same second width 162 as the second contact pads. Since, as mentioned above, the first width 152 will be equal to the second width 162, all conductive mesas in the test structure 100 will have the same width. The test structure 100 can be made of the same conductive material or stack of conductive materials. Specifically, each of the conductive mesas 116a-c, 126a-c in the test structure 100 can comprise an essentially identical stack comprising any one or more of the following conductive layers: a silicide layer, a doped semiconductor layer (e.g., a monocrystalline or polycrystalline layer of silicon, silicon germanium, or any other suitable semiconductor material), a metal layer, a metal alloy layer and a doped raised portion of the substrate 101.

Additionally, within each of the TLM structures 110, 120, the conductive mesas can have progressively increasing third lengths. Specifically, within the first TLM structure 110, the conductive mesa 116a can have a third length 117a, the conductive mesa 116b can have a third length 117b that is longer than the third length 117a of the conductive mesa 116a, and the conductive mesa 116c can have a third length 117c that is longer than the third length 117b of the conductive mesa 116b. Furthermore, within the second TLM structure 120, the conductive mesa 126a can have a third length 117a, the conductive mesa 116b can have a third length 127b that is longer than the third length 127a of the conductive mesa 126a, and the conductive mesa 126c can have a third length 127c that is longer than the third length 127b of the conductive mesa 116b. It should be noted that any conductive mesa in the first TLM structure 110 will have the same third length as the corresponding conductive mesa in the second TLM structure 120. That is, the third length 117a of the conductive mesa 116a in the first TLM structure 110 will be the same as the corresponding third length 127a of the corresponding conductive mesa 126a in the second TLM structure 120; the third length 117b of the conductive mesa 116b in the first TLM structure 110 will be the same as the corresponding third length 127b of the corresponding conductive mesa 126b in the second TLM structure 120; and the third length 117c of the conductive mesa 116a in the first TLM structure 110 will be the same as the corresponding third length 127c of the corresponding conductive mesa 126c in the second TLM structure 120.

Finally, each conductive mesa can be separated from any adjacent contact pads in either the first TLM structure 110 or the second TLM structure 120 by same distance. That is, each conductive mesa in the first TLM structure 110 can be separated from any adjacent contact pad by a distance 115 equal to one-half the first length 114a of the initial space 113a. Similarly, each conductive mesa in the second TLM structure 120 can be separated from any adjacent contact pad by a distance 125 equal to one-half the first length 124a of the initial space 123a. Since the first length 114a of the initial space 113a in the first TLM structure 110 is equal to the first length 124a of the initial space 123a in the second TLM structure 120, the distances 115 and 125 will be the same.

The second TLM structure 120 only (i.e., not the first TLM structure 110) can further comprise a single conductive layer 128a-c (i.e., only one conductive layer) covering the top surface of each of the conductive mesas 126a-c within the additional spaces 124b-e in its row of contact pads. This single conductive layer 128a-c on each of the conductive mesas 126a-c, respectively, can comprise a single silicide layer, a single doped semiconductor layer, a single metal layer, a single metal alloy layer or any other single layer of conductive material. Thus, the second TLM structure 120 differs from the first TLM structure 110 only with respect to the presence of this single conductive layer 128a-c covering each conductive mesa 126a-c, respectively, and the resulting conductive mesa to conductive layer interfaces 129a-c, respectively (which also have the same progressively increasing third lengths 127a-c).

Current-voltage measurements can be acquired from such a test structure 100 at a probing station and used, as described in greater detail below, with regard to the system and method embodiments to characterize the resistance, not of the contact pads 111a-e or 121a-e as is done with prior art TLM structures such as that shown in FIG. 1, but rather to characterize the interface resistance of each of the interfaces 129a-c at the different lengths 127a-c, respectively.

Figure 3:
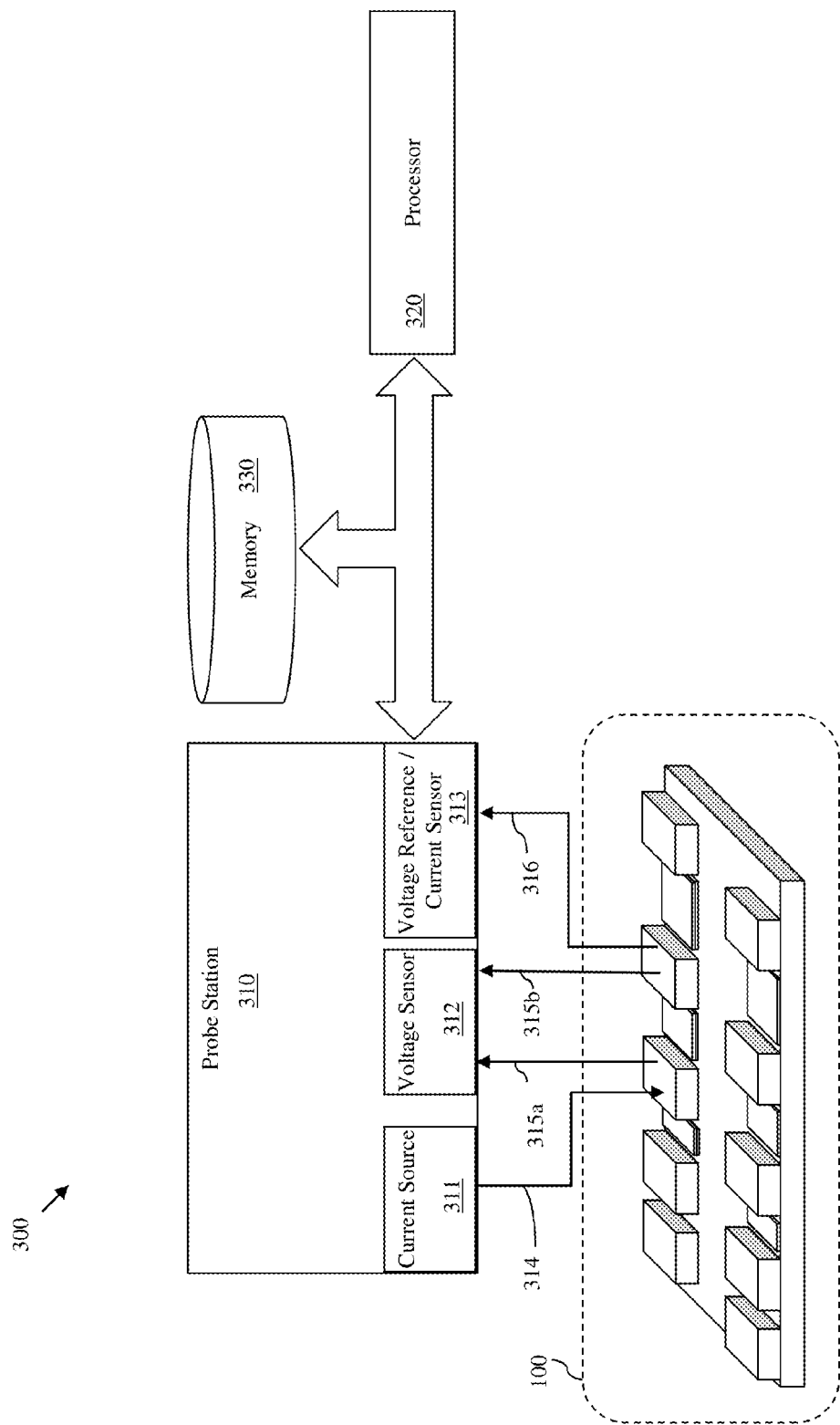
FIG. 3 is a schematic drawing illustrating an embodiment of a test system that incorporates a test structure such as that illustrated in FIG. 2.

More particularly, referring to FIG. 3, also disclosed herein are embodiments of a system 300 that incorporates the above-described test structure 100 of FIG. 1 for characterizing resistance and, particularly, for characterizing a specific interface resistance within a multi-layer conductive structure, such as a multi-layer ohmic contact. Specifically, referring to FIG. 3 in combination with FIG. 1, the system 300 can comprise a test structure 100, as described in detail above, comprising a semiconductor substrate 101 and two transmission line model (TLM) structures (i.e., a first TLM structure 110 and a second TLM structure 120) on the semiconductor substrate 101 and differing only with respect to the presence of the a single conductive layer 128a-c (i.e., only one conductive layer) covering each conductive mesa 126a-c and the resulting conductive mesa to conductive layer interfaces 129a-c.

The system 300 can further comprise a probing station 310 that acquires (i.e., that is adapted to acquire, that is configured to acquire, etc.) first current-voltage measurements from the row of contact pads 111a-e in the first TLM structure 110 of the test structure 100 and second current-voltage measurements from the row of contact pads 121a-e in the second TLM structure 120. Specifically, the probing station 310 can comprise a first probe 314 that can be electrically connected between a current source 311 and a first contact pad in a selected pair of adjacent contact pads in the first row or second row for applying a current I thereto. The probing station 310 can further comprise one or more second probes 315a-b that can be electrically connected between a voltage sensor 312 and both the first contact pad and the second contact pad in the selected pair for measuring a first voltage $V_1$ and a second voltage $V_2$, respectively. Additionally, the probing station 310 can further comprise a third probe 316 that can be electrically connected between a current sensor 313 and the second contact pad in the selected pair of contacts pads for measuring and, particularly, verifying the current I value. This current sensor 313 can set (i.e., can be adapted to set, configured to set, etc.) the voltage reference (e.g., ground) for the current-voltage measurements. Such probing stations are well known in the art and, thus, the details are omitted from this specification in order to allow the reader to focus on the salient aspects of the disclosed embodiments.

In the embodiments disclosed herein, for each pair of adjacent contact pads in the first TLM structure 110 (e.g., the contact pads 111a and 111b, the contact pads 111b and 111c, and so on), the first current-voltage measurements can comprise the voltage measurements $V_1$ on the first contact pad in the pair and $V_2$ on the second contact pad in the pair, given the applied current I between the pair. Similarly, for each pair of adjacent contact pads in the second TLM structure 120 (e.g., the contact pads 121a and 121b, the contact pads 121b and 1121c, and so on), the second current-voltage measurements can comprise the voltage measurements $V_1$ on the first contact pad in the pair and $V_2$ on the second contact pad in the pair, given the applied current I between the pair.

The system 300 can further comprise a processor 320 that receives (i.e., is adapted to receive, configured to receive, etc.) the first current-voltage measurements for each pair of adjacent contact pads 111a-e on the first TLM structure 110 and the second current-voltage measurements for each pair of adjacent contact pads 121a-e on the second TLM structure 120 (e.g., either communicated directly from the probing station 310 or accessed from memory 330) and characterizes (i.e., is adapted to characterize, is configured to characterize, is programmed to characterize, etc.) specific conductive mesa to conductive layer interface resistances associated with specific conductive mesas within specific additional spaces in the second TLM structure based on the first current-voltage measurements and the second current-voltage measurements. That is, the processor 320 can characterize the specific conductive mesa to conductive layer interface resistance at the interface 129a between the conductive mesa 126a within the additional space 123b and the conductive layer 128a thereon, can characterize the specific interface resistance at the interface 129b between the conductive mesa 126b within the additional space 123c and the conductive layer 128b thereon, etc.

In order to characterize the specific conductive mesa to conductive layer interface resistances associated with specific conductive mesas between specific pairs of adjacent contact pads 121b-c, 121c-d, and so on in the second TLM structure 120, the processor 320 can extract (i.e., can be adapted to extract, can be configured to extract, can be programmed to extract, etc.) first sets of resistance parameters using first resistance expressions.

Figure 4:
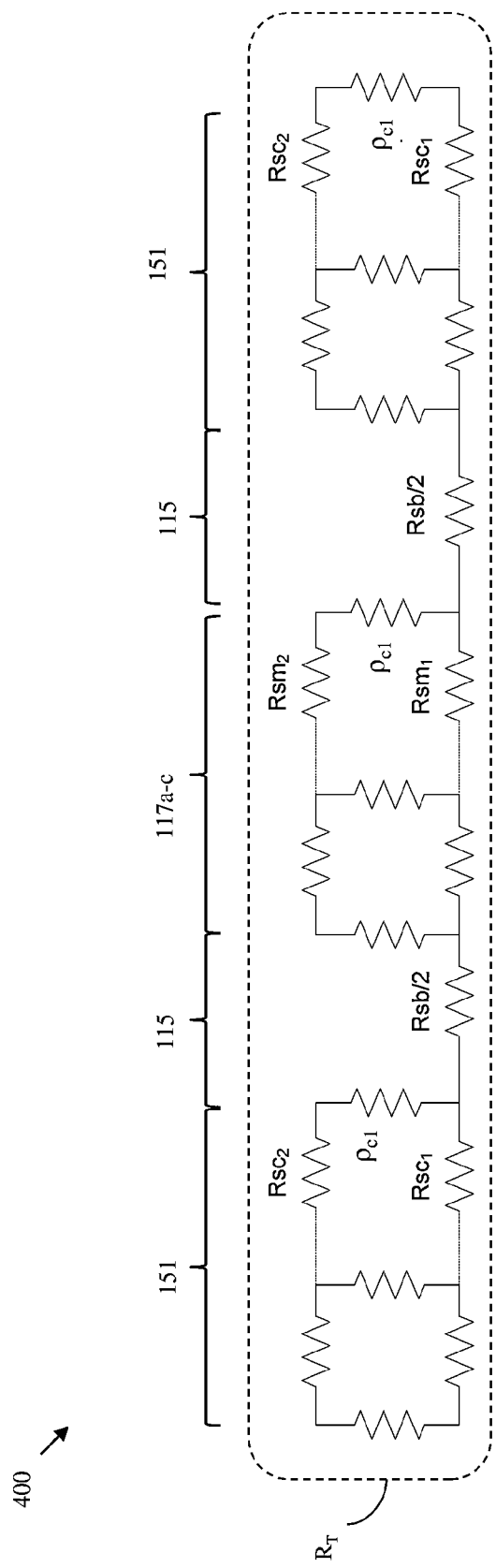
FIG. 4 is a lumped constant distributed resistance diagram illustrating resistance components present in the first TLM structure of the test structure of FIG. 2.

Specifically, FIG. 4 is a lumped constant distributed resistance diagram illustrating the two-layer first TLM structure 110 and, particularly, the various resistance components present between any two adjacent additional contact pads 111b-c, 111c-d or 111d-e in the first TLM structure 110. For each pair of adjacent additional contact pads in the first TLM structure 110, the processor 320 can use the previously acquired first current-voltage measurements to solve for a first set of resistance parameters for that pair, including $R_T$, $R_{sb}$, $R_{mesa}$, $R_c$, $R_{sm1}$, $R_{sm2}$ and $\rho_{c1}$, in the following first resistance expressions:

$$R_T = (V_1 - V_2)/I, \quad (1)$$

$$R_T = R_{sb}\frac{L_{body}}{W} + R_{mesa} + 2R_c, \quad (2)$$

$$R_{mesa} = \frac{2L_T R_{sm1}^2}{(R_{sm1} + R_{sm2})W}\tanh\left(\frac{L_m}{2L_T}\right) + \frac{R_{sm1}R_{sm2}}{(R_{sm1} + R_{sm2})}\frac{L_m}{W}, \quad (3)$$

and $$L_{T1} = \sqrt{\frac{\rho_{c1}}{(R_{sm1} + R_{sm2})}}. \quad (4)$$

In these first resistance expressions (1)-(4), $R_T$ represents the total contact pad to contact pad resistance for the corresponding specific additional space 113b-d in the first TLM structure 110 between the corresponding specific pair of adjacent contact pads (i.e., for the additional space 113$b$-$d$ in the first TLM structure 110 which corresponds to the specific additional space 123$b$-$d$ in the second TLM structure 120 that contains the specific interface 129$a$-$c$ at issue). As mentioned above, $V_1$ and $V_2$ are the first current-voltage measurements and specifically represent voltage measurement taken at the first and second contact pads of the corresponding specific pair in response to an applied voltage I. $R_{sb}$ represents a semiconductor substrate sheet resistance across the initial space 113$a$ in the first TLM structure 110 and this semiconductor substrate sheet resistance $R_{sb}$ is also present between each additional space because, as mentioned above with regard to the test structure embodiments, the second lengths 114$b$-$d$ are progressively increasing but each second length of each additional space is equal to the sum of the third length of the conductive mesa contained therein plus the first length 114$a$ of the initial space 113$a$. $L_{body}$ represents the first length 114$a$ of the initial space 113$a$ in the first TLM structure 110. W represents the width of the conducting mesas, which is the same for all conducting mesas in the test structure 100. $L_m$ represents the second length 117$a$-$c$ of the corresponding specific conductive mesa 116$a$-$c$ in the corresponding specific additional space 113$b$-$d$ in the first TLM structure (i.e., $L_m$ represents the second length 117$a$-$c$ of the conductive mesa 116$a$-$c$ that corresponds to the conductive mesa 126$a$-$c$ at issue in the second TLM structure 120). $R_{mesa}$ represents the total conductive mesa resistance of the corresponding specific conductive mesa 116$a$-$c$ in the first TLM structure 110 (i.e., $R_{mesa}$ represents the total resistance of the conductive mesa 116$a$-$c$ which corresponds to the conductive mesa 126$a$-$c$ at issue in the second TLM structure 120). $L_T$ represents the semiconductor substrate to conductive mesa interface transfer length associated with the corresponding specific conductive mesa 116$a$-$c$ (i.e., $L_T$ represents interface transfer length associated with the conductive mesa 116$a$-$c$, which corresponds to the conductive mesa 126$a$-$c$ at issue in the second TLM structure 120). $R_{sm1}$ represents the semiconductor substrate sheet resistance within the portion of the corresponding specific additional space 117$b$-$d$ aligned below the corresponding specific conductive mesa 116$a$-$c$. $R_{sm2}$ represents the conductive mesa sheet resistance associated with the corresponding specific conductive mesa 116$a$-$c$ and $\rho_{c1}$ represents the semiconductor substrate to conductive mesa interface resistance associated with the corresponding specific conductive mesa 116$a$-$c$.

In practice, once the first current-voltage measurements (i.e., $V_1$ and $V_2$ at applied current I) for the all the pairs of adjacent contact pads in the first TLM structure 110 are acquired, they can be used to determine the $R_T$ values for the pairs of additional adjacent contact pads in the first TLM structure 110 using equations (1)-(2). Then, the data points ($R_T$, $L_m$) for each of the pairs of additional adjacent contact pads in the first TLM structure 110 can be fit to the 2-layer model for $R_T$ by non-linear regression to obtain $L_T$, $R_{sm1}$, and $R_{sm2}$, using expressions (3)-(4). $\rho_{c1}$ can be determined from these resistance values. It should be noted that since the contact pads are all identical the value of $R_c$ is not a factor as any variations in the overall resistance of the first TLM structure 110 is locked into the variations in resistance of the conductive mesas. It should also be noted that the two-layers in this case refer to the semiconductor substrate and the conductive mesa thereon, regardless of the number of different conductive layers, which may be included within the conductive mesa.

After extracting the first set of resistance parameters $R_T$, $R_{sb}$, $R_{mesa}$, $R_c$, $R_{sm1}$, $R_{sm2}$ and $\rho_{c1}$ associated with each of the pairs of additional adjacent contact pads in the first TLM structure 110, the processor 320 can extract (i.e., can be adapted to extract, can be configured to extract, can be programmed to extract, etc.) second sets of resistance parameters using second resistance expressions. This extracting process takes advantage of the fact that the second TLM structure 120 differs from the first TLM structure 110 only with respect to the presence of this single conductive layer 128$a$-$c$ covering each conductive mesa 126$a$-$c$, respectively, and the resulting conductive mesa to conductive layer interfaces 129$a$-$c$, respectively (which also have the same progressively increasing third lengths 127$a$-$c$) and, thus, the values for $R_T$, $R_{sb}$, $R_{mesa}$, $R_c$, $R_{sm1}$, $R_{sm2}$ and $\rho_{c1}$ for the pairs of additional adjacent contact pads in the second TLM structure 120 will be the same as the values extracted for the corresponding pairs of additional contact pads the first TLM structure 110.

Figure 5:
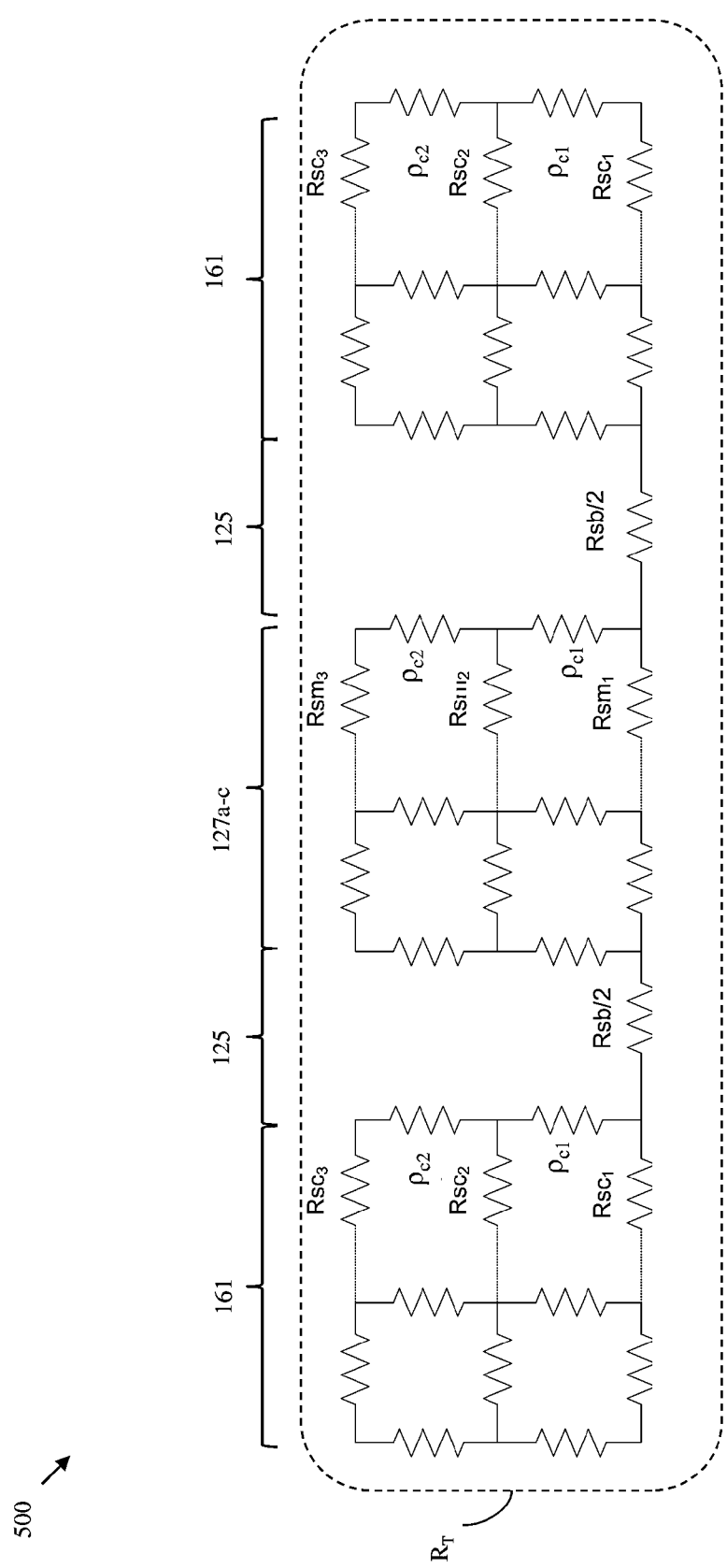
FIG. 5 is a lumped constant distributed resistance diagram illustrating resistance components present in the second TLM structure of the test structure of FIG. 2.

Specifically, FIG. 5 is another lumped constant distributed resistance diagram illustrating the three-layer second TLM structure 120 and, particularly, the various resistance components present between any two adjacent additional contact pads 121$b$-$c$, 121$c$-$d$ or 121$d$-$e$ in the second TLM structure 120. For the pairs of adjacent additional contact pads in the second TLM structure 120, the process of extracting of the second sets of resistance parameters can comprise, for each pair of additional adjacent contact pads, using the second current-voltage measurements and the first set of resistance parameters of $R_T$, $R_{sb}$, $R_{mesa}$, $R_c$, $R_{sm1}$, $R_{sm2}$ and $\rho_{c1}$ to solve for a second set of resistance parameters, including $R_{sm3}$ and $\rho_{c2}$, in the following second resistance expressions:

$$R_{mesa} = \frac{2R_{sm1}^2}{\rho_{C1}(A^2 - B^2)W}\left\{\frac{1}{A}\left[1 - \frac{\rho_{C1}B^2(R_{sm2} + R_{sm3})R_{seq}}{R_{sm1}R_{sm2}R_{sm3}}\right]\tanh\left(\frac{L_m}{2L_{T1}}\right) - \frac{1}{B}\left[1 - \frac{\rho_{C1}A^2(R_{sm2} + R_{sm3})R_{seq}}{R_{sm1}R_{sm2}R_{sm3}}\right]\tanh\left(\frac{L_m}{2L_{T2}}\right)\right\} + R_{seq}\frac{L_m}{W}, \quad (5)$$

$$R_{seq} = \frac{R_{sm1}R_{sm2}R_{sm3}}{R_{sm1}R_{sm2} + R_{sm2}R_{sm3} + R_{sm1}R_{sm3}}, \quad (6)$$

where $$a = \frac{R_{sm1}}{\rho_{C1}} \quad b = \frac{R_{sm2}}{\rho_{C1}} \quad c = \frac{R_{sm2}}{\rho_{C2}} \quad d = \frac{R_{sm3}}{\rho_{C2}},$$

$$A = \sqrt{\frac{1}{2}\left(a + b + c + d + \sqrt{((a+b)-(c+d))^2 + 4bc}\right)}, \quad (7)$$

and $$B = \sqrt{[a + b + c + d] - A^2}, \quad (8)$$

where $\quad (9)$ $$L_{T1} = 1/A$$
$$L_{T2} = 1/B.$$

In these second resistance expressions $R_{sm3}$ represents the conductive layer sheet resistance associated with the conductive layer 128$a$-$c$ on the specific conductive mesa 126$a$-$c$ at issue. $R_{seq}$ represents the total equivalent mesa sheet resistance in three-layer structure. $L_{T2}$ represents the conductive mesa to conductive layer transfer length associated with the specific conductive mesa 126$a$-$c$ at issue and $\rho_{c2}$ represents the specific conductive mesa to conductive layer interface resistance of the interface 129$a$-$c$.

In practice, once the second current-voltage measurements (i.e., $V_1$ and $V_2$ at applied current I) are acquired for the all the pairs of adjacent contact pads in the second TLM structure 120 are acquired, they can be used to determine the $R_T$ values for the pairs of additional adjacent contact pads in the second TLM structure 120 using equations (1)-(2). Then, the data points ($R_T$, $L_m$) for each of the pairs of additional adjacent contact pads in the second TLM structure 120 can be fit to the 3-layer model for $R_T$ by non-linear regression using the previously acquired values for $R_{sm1}$, $R_{sm2}$, and $\rho_{c1}$ from the 2-layer model and the expressions (6)-(9) in order to obtain the values for $R_{sm3}$, and $\rho_{c2}$. It should be noted that the three-layers in this case refer to the semiconductor substrate, the conductive mesa thereon (regardless of the number of different conductive layers which may be included within the conductive mesa) and the single conductive layer on the conductive mesa.

Consequently, the system 300 is able to use the same test structure 100 of FIG. 1 to characterize the specific interface resistances of the conductive mesa to conductive layer interfaces 129a-c, which are essentially identical except for the different lengths 127a-c.

For purposes of illustration the TLM structures 110, 120 are each illustrated and described above as having three different conducting mesas 116a-c, 126a-c with three different lengths 117a-c, 127a-c. Alternatively, each of these TLM structures can comprise any number of conducting mesas with a corresponding number of different lengths (e.g., 5 conducting mesas with 5 different lengths, 10 conducting mesas with 10 different lengths, and so on).

Figure 6:
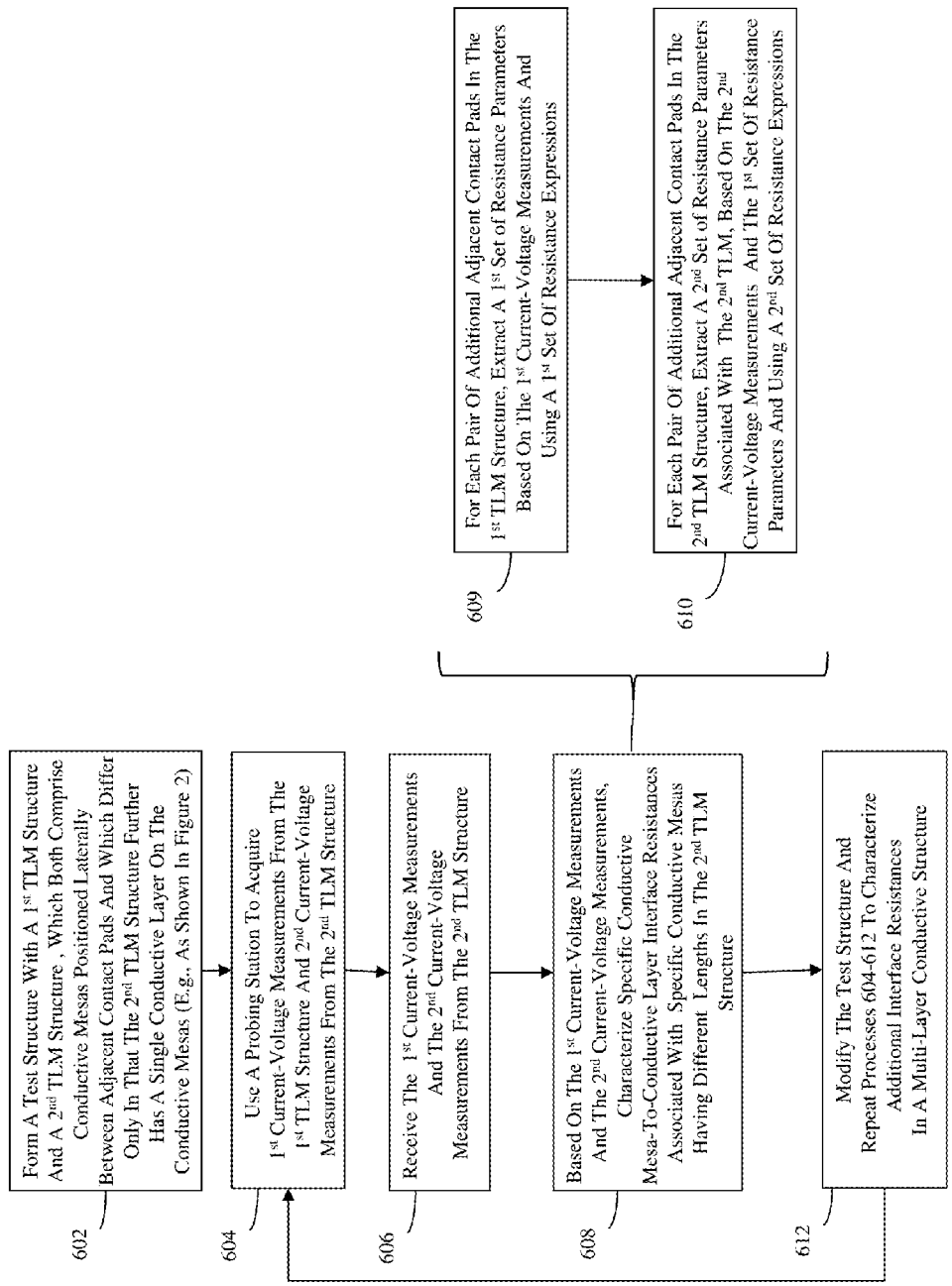
FIG. 6 is a flow diagram illustrating an embodiment of a test method.

Referring to FIG. 6, also disclosed herein are embodiments of an associated method that incorporates the above-described test structure 100 of FIG. 1 for characterizing resistance and, particularly, for characterizing a specific interface resistance within a multi-layer conductive structure, such as a multi-layer ohmic contact. The method can comprise forming a test structure 100, as described in detail above and illustrated in FIG. 1, comprising a semiconductor substrate 101 and two transmission line model (TLM) structures (i.e., a first TLM structure 110 and a second TLM structure 120) on the semiconductor substrate 101 and differing only with respect to the presence of the conductive layer 128a-c covering each conductive mesa 126a-c in the second TLM structure 120 and the resulting conductive mesa to conductive layer interfaces 129a-c (602).

The method can further comprise acquiring first current-voltage measurements from the row of contact pads 111a-e in the first TLM structure 110 and second current-voltage measurements from the row of contact pads 121a-e in the second TLM structure 120 (604). Specifically, the first current-voltage measurements can comprise, for each adjacent pair of contact pads 111a-e in the first TLM structure 110 (e.g., for adjacent contact pads 111a and 111b, for adjacent contact pads 111b and 111c, and so on), a first voltage $V_1$ measured at a first contact pad in the pair and a second voltage $V_2$ measured at a second contact pad in the pair in response to a current I applied to the first contact pad. Optionally, the first current-voltage measurements can also comprise a current measurement taken at the second contact pad for verification purposes. Similarly, the second current-voltage measurements can comprise, for each adjacent pair of contact pads 121a-e in the second TLM structure 120 (e.g., for adjacent contact pads 121a and 121b, for adjacent contact pads 121b and 121c, and so on), a first voltage $V_1$ measured at a first contact pad in the pair and a second voltage $V_2$ measured at a second contact pad in the pair in response to a current I applied to the first contact pad.

Optionally, the second current-voltage measurements can also comprise a current measurement taken at the second contact pad for verification purposes. Techniques for acquiring such current-voltage measurements (e.g., through the use of a probing station 310, as shown in the system 300 of FIG. 3) are well known in the art and, thus, the details are omitted from this specification in order to allow the reader to focus on the salient aspects of the disclosed embodiments.

Next, the method can comprise receiving (e.g., by a processor 320 either directly from the probing station 310 or accessed from memory 330, as shown in FIG. 3) the first current-voltage measurements and the second current-voltage measurements acquired at process 604 (606).

Then, based on the first current-voltage measurements and the second current-voltage measurements, each of the specific interface resistances of the specific conductive mesa to conductive layer interfaces 129a-c, which have different lengths 127a-c and which are associated with specific conductive mesas 126a-c and conductive layers 128a-c thereon, can be characterized (e.g., by the processor 320) (608).

In order to characterize each specific interface resistance at process 608, first sets of resistance parameters can be extracted using first resistance expressions (609). Specifically, for each pair of adjacent additional contact pads in the first TLM structure 110, the previously acquired first current-voltage measurements can be used to solve for a first set of resistance parameters for that pair, including $R_T$, $R_{sb}$, $R_{mesa}$, $R_c$, $R_{sm1}$, $R_{sm2}$ and $\rho_{c1}$, in the first resistance expressions (1)-(4) above.

In practice at process 609, once the first current-voltage measurements (i.e., $V_1$ and $V_2$ at applied current I) for the all the pairs of adjacent contact pads in the first TLM structure 110 are acquired, they can be used to determine the $R_T$ values for the pairs of additional adjacent contact pads in the first TLM structure 110 using equations (1)-(2). Then, the data points ($R_T$, $L_m$) for each of the pairs of additional adjacent contact pads in the first TLM structure 110 can be fit to the 2-layer model for $R_T$ by non-linear regression to obtain $L_T$, $R_{sm1}$, and $R_{sm2}$, using expressions (3)-(4). $\rho_{c1}$ can be determined from these resistance values. It should be noted that since the contact pads are all identical the value of $R_c$ is not a factor as any variations in the overall resistance of the first TLM structure 110 is locked into the variations in resistance of the conductive mesas. It should also be noted that the two-layers in this case refer to the semiconductor substrate and the conductive mesa thereon, regardless of the number of different conductive layers, which may be included within the conductive mesa.

After extracting the first sets of resistance parameters $R_T$, $R_{sb}$, $R_{mesa}$, $R_c$, $R_{sm1}$, $R_{sm2}$ and $\rho_{c1}$ for each of the pairs of additional adjacent contact pads in the first TLM structure 110, second sets of resistance parameters can be extracted using second resistance expressions (610). This extracting process takes advantage of the fact that the second TLM structure 120 differs from the first TLM structure 110 only with respect to the presence of this single conductive layer 128a-c covering each conductive mesa 126a-c, respectively, and the resulting conductive mesa to conductive layer interfaces 129a-c, respectively (which also have the same progressively increasing third lengths 127a-c) and, thus, the values for $R_T$, $R_{sb}$, $R_{mesa}$, $R_c$, $R_{sm1}$, $R_{sm2}$ and $\rho_{c1}$ for the pairs of additional adjacent contact pads in the second TLM structure 120 will be the same as the values extracted for the corresponding pairs of additional contact pads the first TLM structure 110. Specifically, for the pairs of adjacent additional contact pads in the second TLM structure 120, the process of extracting of the second sets of resistance parameters can comprise, for each pair of additional adjacent contact pads, using the second current-voltage measurements and the first set of resistance parameters of $R_T$, $R_{sb}$, $R_{mesa}$, $R_c$, $R_{sm1}$, $R_{sm2}$ and $\rho_{c1}$ to solve for a second set of resistance parameters, including $R_{sm3}$ and $\rho_{c2}$, in the second resistance expressions (5)-(9) above.

In practice at process 610, once the second current-voltage measurements (i.e., $V_1$ and $V_2$ at applied current I) are acquired for the all the pairs of adjacent contact pads in the second TLM structure 120 are acquired, they can be used to determine the $R_T$ values for the pairs of additional adjacent contact pads in the second TLM structure 120 using equations (1)-(2). Then, the data points ($R_T$, $L_m$) for each of the pairs of additional adjacent contact pads in the second TLM structure 120 can be fit to the 3-layer model for $R_T$ by non-linear regression using the previously acquired values for $R_{sm1}$, $R_{sm2}$, and $\rho_{c1}$ from the 2-layer model and the expressions (6)-(9) in order to obtain the values for $R_{sm3}$, and $\rho_{c2}$. It should be noted that the three-layers in this case refer to the semiconductor substrate, the conductive mesa thereon (regardless of the number of different conductive layers which may be included within the conductive mesa) and the single conductive layer on the conductive mesa.

Consequently, the method is able to use the same test structure 100 of FIG. 1 to characterize the specific interface resistances of the conductive mesa to conductive layer interfaces 129a-c, which are essentially identical except for the different lengths 127a-c.

The method can further comprise, after the first current-voltage measurements and the second current-voltage measurements are acquired at process 604, modifying the test structure 100 of FIG. 1 so as to form a modified test structure that will allow the interface resistances at different lengths of a different conductive layer to conductive layer interface to be characterized (612). For example, in the modified test structure, the same conductive layer from the second TLM structure 120 can be formed on the conductive mesas 111a-e in the first TLM structure 110 to create a modified first TLM structure. An additional conductive layer can be formed on the conductive layers 128a-c in the second TLM structure 120 only in order to a modified second TLM structure. In this case, the method can further comprise repeating the processes 604-608 with regard to the modified test structure. That is, additional first current-voltage measurements from the row of contact pads in the modified first TLM structure and additional second current-voltage measurements from the row of contact pads in the modified second TLM structure can be acquired (e.g., using a probing station). Next, the additional first current-voltage measurements and the additional second current-voltage measurements can be received, a specific conductive layer to additional conductive layer interface within the modified second TLM structure can be selected, and the conductive layer to additional conductive layer interface resistance of that selected interface can be characterized, based on the additional first current-voltage measurements and the additional second current-voltage measurements, in the same manner as described above with regard to the original test structure.

The processes 604-612 can further be iteratively repeated in order to characterize multiple different interfaces (e.g., of a given multi-layer conductive structure) at multiple different lengths of interest.

It should be understood that the processes described above and illustrated in the flow diagram of FIG. 6 are not intended to be limiting. More specifically, it should be understood that the processes represented by the discrete boxes within the flow diagram of FIG. 6 may be performed in the sequence shown or, alternatively, in any other suitable sequence. Furthermore, multiple process steps that are represented by a single discrete box within the flow diagram of FIG. 6 may be performed in conjunction with each other or, alternatively, may be performed at different times and/or in a different order with respect to other processes represented by other discrete boxes in the flow diagram. For example, the process step referred to in box 604 of using the probe station to acquire $1^{st}$ current-voltage measurements from the first TLM structure may be performed followed by the process represented by box 609 of extracting the first set of resistance parameters based on the $1^{st}$ current-voltage measurements and using the $1^{st}$ resistance expressions. Subsequently, the additional process step referred to in box 604 of using the probe station to acquire $2^{nd}$ current-flow measurements from the second TLM structure may be performed followed by the process represented by box 610 of extracting the second set of resistance parameters based on the $2^{nd}$ current-voltage measurements and the $1^{st}$ set of resistance parameters and using the $2^{nd}$ resistance expressions to ultimately achieve the process represented by the box 608 of characterizing the interface resistance at a specific conductive mesa-to-conductive layer interface in the first TLM structure 110.

Also disclosed herein are embodiments of a computer program product. This computer program product can comprise a tangible computer readable storage device. The tangible computer readable storage device can store program code that is executable by a computer to perform the above-described method for characterizing resistance and, particularly, for characterizing a specific interface resistance within a multi-layer conductive structure, such as a multi-layer ohmic contact.

More particularly, as will be appreciated by one skilled in the art, aspects of the disclosed embodiments may be implemented as a method, a system or a program storage device (i.e., a computer program product). Accordingly, aspects of the disclosed embodiments may be implemented entirely in hardware, entirely in software (including firmware, resident software, micro-code, etc.) or in a combination of software and hardware and may generally be referred to herein as a "circuit," "module" or "system." Furthermore, aspects of the disclosed embodiments may take the form of a program storage device (i.e., a computer program product) embodied in one or more computer readable medium(s) having computer readable program code embodied thereon.

Any combination of one or more computer readable medium(s) may be utilized. The computer readable medium may be a non-transitory computer readable storage medium or computer readable signal medium. A computer readable storage medium may be, for example, but is not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed embodiments are described below with reference to flowchart illustrations and/or block diagrams of methods, apparatus (systems) and computer program products. It will be understood that each block of the flowchart illustrations and/or D-2 block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 7:
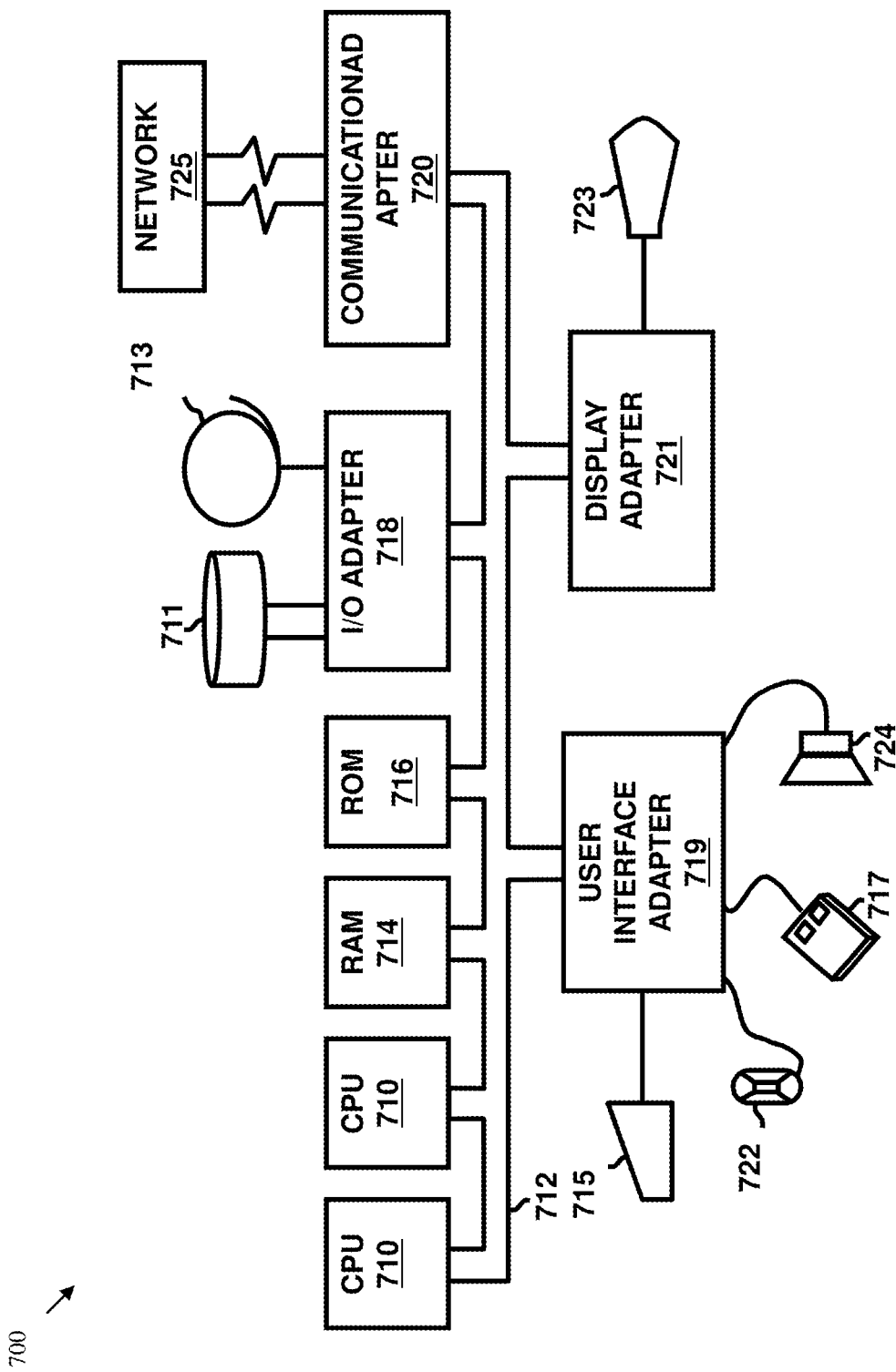
FIG. 7 is a schematic diagram illustrating a representative hardware environment for implementing disclosed system, method, and computer program product embodiments disclosed herein.

A representative hardware environment for implementing the method, system and computer program product of the disclosed embodiments is depicted in FIG. 7. This schematic drawing illustrates a hardware configuration of an information handling/computer 700. The computer 700 comprises at least one processor or central processing unit (CPU) 710. The CPUs 710 are interconnected via system bus 712 to various devices such as a random access memory (RAM) 714, read-only memory (ROM) 716, and an input/output (I/O) adapter 718. The I/O adapter 718 can connect to peripheral devices, such as disk units 711 and tape drives 713, or other program storage devices that are readable by the system. The system can read the inventive instructions on the program storage devices and follow these instructions to execute the disclosed method embodiments. The system further includes a user interface adapter 19 that connects a keyboard 715, mouse 717, speaker 724, microphone 722, and/or other user interface devices such as a touch screen device (not shown) to the bus 712 to gather user input. Additionally, a communication adapter 720 connects the bus 712 to a data processing network 725, and a display adapter 721 connects the bus 712 to a display device 723 which may be embodied as an output device such as a monitor, printer, or transmitter, for example.

It should be understood that the flowchart and block diagrams in the Figures illustrate the architecture, functionality, and operation of possible implementations of systems, methods and computer program products according to the disclosed embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It should further be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, the descriptions of the various embodiments disclosed herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are embodiments of a test structure as well as embodiments of a system, method, and computer program product that acquire current-voltage measurements from this unique test structure in order to characterize a specific interface resistance within a multi-layer conductive structure, such as a multi-layer ohmic contact. The test structure embodiments incorporate a first transmission line model (TLM) structure and a second TLM structure. The first and second TLM structures both incorporate a row of essentially identical contact pads separated by spaces with progressively increasing lengths. Conductive mesas, also with progressively increasing lengths, are positioned within the spaces between all but the initial pair of adjacent contacts pads. The first and second TLM structures differ only with respect to the presence of a single conductive layer on each of the conductive mesas and, thereby the resulting conductive mesa to conductive layer interfaces. The system, method and computer program product embodiments are able to extract resistance parameters associated with the first and second TLM structures, including conductive mesa to conductive layer interface resistances, based on first current-voltage measurements acquired from the first TLM structure and second current-voltage measurements acquired from the second TLM structure.

What is claimed is:

1. A test structure comprising:
   a semiconductor substrate;
   a first transmission line model structure on said substrate; and
   a second transmission line model structure on said substrate,
      said first transmission line model structure and said second transmission line model structure each comprising:
         a row of contact pads comprising an initial contact pad and a group of additional contact pads adjacent to said initial contact pad, said initial contact pad being separated from said group by an initial space having a first length and pairs of additional contacts being separated by additional spaces having progressively increasing second lengths that are greater than said first length; and
         conductive mesas in said additional spaces,
      said second transmission line model structure only further comprising a conductive layer on a top surface of each of said conductive mesas.

2. The test structure of claim 1, said conductive mesas being centered within said additional spaces and having progressively increasing third lengths.

3. The test structure of claim 1, said initial contact pad and said additional contact pads in said row of contact pads being identical.

4. The test structure of claim 1, said conductive mesas each comprising at least one of the following:
   a silicide layer;
   a doped semiconductor layer;
   a metal layer;
   a metal alloy layer; and
   a doped raised portion of said substrate.

5. The test structure of claim 1, said conductive layer comprising any one of a single silicide layer, a single doped semiconductor layer, a single metal layer and a single metal alloy layer.

6. A system for characterizing resistance, said system comprising:
   a test structure comprising:
      a semiconductor substrate;
      a first transmission line model structure on said substrate; and
      a second transmission line model structure on said substrate,
         said first transmission line model structure and said second transmission line model structure each comprising:
            a row of contact pads comprising an initial contact pad and a group of additional contact pads adjacent to said initial contact pad, said initial contact pad being separated from said group by an initial space having a first length and pairs of additional contacts being separated by additional spaces having progressively increasing second lengths that are greater than said first length; and
            conductive mesas centered within said additional spaces and having progressively increasing third lengths,
         said second transmission line model structure only further comprising a conductive layer on a top surface of each of said conductive mesas;
   a probing station acquiring first current-voltage measurements from said row of contact pads in said first transmission line model structure and second current-voltage measurements from said row of contact pads in said second transmission line model structure; and
   a processor characterizing a specific conductive mesa to conductive layer interface resistance associated with a specific conductive mesa within a specific additional space in said second transmission line model structure based on said first current-voltage measurements and said second current-voltage measurements.

7. The system of claim 6, said initial contact pad and said additional contact pads in said row of contact pads being identical.

8. The system of claim 6, said conductive mesas each comprising at least one of the following:
   a silicide layer;
   a doped semiconductor layer;
   a metal layer;
   a metal alloy layer; and
   a doped raised portion of said substrate.

9. The system of claim 6, said conductive layer comprising any one a single silicide layer, a single doped semiconductor layer, a single metal layer and a single metal alloy layer.

10. The system of claim 6, said processor characterizing said specific conductive mesa to conductive layer interface resistance by performing the following:
    extracting a first set of resistance parameters associated with said first transmission line model structure based on said first current-voltage measurements; and
    extracting a second set of resistance parameters associated with said second transmission line model structure based on said second current-voltage measurements and said first set of resistance parameters, said second set of resistance parameters comprising at least said specific conductive mesa to conductive layer interface resistance.

11. The system of claim 10, said extracting of said first set of resistance parameters comprising using said first current-voltage measurements to solve for $R_T$, $R_{sb}$, $R_{mesa}$, $R_c$, $R_{sm1}$, $R_{sm2}$ and $\rho_{c1}$ in the following first resistance expressions:

$$R_T = R_{sb}\frac{L_{body}}{W} + R_{mesa} + 2Rc,$$

$$R_{meas} = \frac{2L_T R_{sm1}^2}{(R_{sm1} + R_{sm2})W}\tanh\left(\frac{L_m}{2L_T}\right) + \frac{R_{sm1}R_{sm2}}{(R_{sm1} + R_{sm2})}\frac{L_m}{W},$$

and $$L_{T1} = \sqrt{\frac{\rho_{C1}}{(R_{sm1} + R_{sm2})}},$$

where $R_T$ represents a total contact pad to contact pad resistance for a corresponding specific additional space in said first transmission line model structure, $R_{sb}$ represents a semiconductor substrate sheet resistance across said initial space in said first transmission line model structure, $L_{body}$ represents said first length, W represents a width of said conducting mesas, $L_m$ represents a second length of a corresponding specific conductive mesa in said corresponding specific additional space, $R_c$ represents a contact resistance in said first transmission line model structure, $R_{mesa}$ represents a total conductive mesa resistance of said corresponding specific conductive mesa, $L_T$ represents a semiconductor substrate to conductive mesa interface transfer length associated with said corresponding specific conductive mesa, $R_{sm1}$ represents a semiconductor substrate sheet resistance within a portion said corresponding specific additional space aligned below said corresponding specific conductive mesa, $R_{sm2}$ represents a conductive mesa sheet resistance associated with said corresponding specific conductive mesa, and $\rho_{c1}$ represents a semiconductor substrate to conductive mesa interface resistance associated with said corresponding specific conductive mesa.

12. The system of claim 11, said extracting of said second set of resistance parameters associated with said second transmission line model structure comprising using said second current-voltage measurements and said first set of resistance parameters of $R_T$, $R_{sb}$, $R_{mesa}$, $R_c$, $R_{sm1}$, $R_{sm2}$ and $\rho_{c1}$ to solve for $R_{sm3}$ and $\rho_{c2}$ in the following second resistance expressions:

$$R_{mesa} = \frac{2R_{sm1}^2}{\rho_{C1}(A^2-B^2)W}\left\{\frac{1}{A}\left[1-\frac{\rho_{C1}B^2(R_{sm2}+R_{sm3})R_{seq}}{R_{sm1}R_{sm2}R_{sm3}}\right]\tanh\left(\frac{L_m}{2L_{T1}}\right) - \frac{1}{B}\left[1-\frac{\rho_{C1}A^2(R_{sm2}+R_{sm3})R_{seq}}{R_{sm1}R_{sm2}R_{sm3}}\right]\tanh\left(\frac{L_m}{2L_{T2}}\right)\right\} + R_{seq}\frac{L_m}{W},$$

$$R_{seq} = \frac{R_{sm1}R_{sm2}R_{sm3}}{R_{sm1}R_{sm2}+R_{sm2}R_{sm3}+R_{sm1}R_{sm3}},$$

$$a = \frac{R_{sm1}}{\rho_{C1}} \quad b = \frac{R_{sm2}}{\rho_{C1}} \quad c = \frac{R_{sm2}}{\rho_{C2}} \quad d = \frac{R_{sm3}}{\rho_{C2}},$$

$$A = \sqrt{\frac{1}{2}\left(a+b+c+d+\sqrt{((a+b)-(c+d))^2+4bc}\right)},$$

and $$B = \sqrt{[a+b+c+d]-A^2},$$

where $$L_{T1} = 1/A$$

$$L_{T2} = 1/B,$$

and
where $R_{sm3}$ represents a conductive layer sheet resistance associated with said conductive layer on said specific conductive mesa, $R_{seq}$ represents a total equivalent mesa sheet resistance, $L_{T2}$ represents a conductive mesa to conductive layer transfer length associated with said specific conductive mesa, and $\rho_{c2}$ represents said specific conductive mesa to conductive layer interface resistance.

13. A method for characterizing resistance, said method comprising:
receiving, by a processor, first current-voltage measurements and second current-voltage measurements acquired from a test structure, said test structure comprising:
a semiconductor substrate;
a first transmission line model structure on said substrate; and
a second transmission line model structure on said substrate,
said first transmission line model structure and said second transmission line model structure each comprising:
a row of contact pads comprising an initial contact pad and a group of additional contact pads adjacent to said initial contact pad, said initial contact pad being separated from said group by an initial space having a first length and pairs of additional contacts being separated by additional spaces having progressively increasing second lengths that are greater than said first length; and
conductive mesas centered within said additional spaces and having progressively increasing third lengths,
said second transmission line model structure only further comprising a conductive layer on a top surface of each of said conductive mesas, and
said first current-voltage measurements being acquired by a probing station from said row of contact pads in said first transmission line model structure and said second current-voltage measurement being acquired by said probing station from said row of contact pads in said second transmission line model structure; and
characterizing, by said processor, a specific conductive mesa to conductive layer interface resistance associated with a specific conductive mesa in a specific additional space in said second transmission line model structure based on said first current-voltage measurements and said second current-voltage measurements.

14. The method of claim 13, said initial contact pad and said additional contact pads in said row of contact pads being identical.

15. The method of claim 13, said conductive mesas each comprising at least one of the following:
a silicide layer;
a doped semiconductor layer;
a metal layer;
a metal alloy layer; and
a doped raised portion of said substrate.

16. The method of claim 13, said conductive layer comprising any one a single silicide layer, a single doped semiconductor layer, a single metal layer and a single metal alloy layer.

17. The method of claim 13, said characterizing of said specific conductive mesa to conductive layer interface resistance comprising:
extracting a first set of resistance parameters associated with said first transmission line model structure based on said first current-voltage measurements; and extracting a second set of resistance parameters associated with said second transmission line model structure based on said second current-voltage measurements and said first set of resistance parameters, said second set of resistance parameters comprising at least said specific conductive mesa to conductive layer interface resistance.

18. The method of claim 17, said extracting of said first set of resistance parameters associated with said first transmission line model structure comprising using said first current-voltage measurements to solve for $R_T$, $R_{sb}$, $R_{mesa}$, $R_c$, $R_{sm1}$, $R_{sm2}$ and $\rho_{c1}$ in the following first resistance expressions:

$$R_T = R_{sb}\frac{L_{body}}{W} + R_{mesa} + 2R_c,$$

$$R_{mesa} = \frac{2L_T R_{sm1}^2}{(R_{sm1}+R_{sm2})W}\tanh\left(\frac{L_m}{2L_T}\right) + \frac{R_{sm1}R_{sm2}}{(R_{sm1}+R_{sm2})}\frac{L_m}{W},$$

and $$L_{T1} = \sqrt{\frac{\rho_{c1}}{(R_{sm1}+R_{sm2})}},$$

where $R_T$ represents a total contact pad to contact pad resistance for a corresponding specific additional space in said first transmission line model structure, $R_{sb}$ represents a semiconductor substrate sheet resistance across said initial space in said first transmission line model structure, $L_{body}$ represents said first length, W represents a width of said conducting mesas, $L_m$ represents a second length of a corresponding specific conductive mesa in said corresponding specific additional space, $R_c$ represents a contact resistance in said first transmission line model structure, $R_{mesa}$ represents a total conductive mesa resistance of said corresponding specific conductive mesa, $L_T$ represents a semiconductor substrate to conductive mesa interface transfer length associated with said corresponding specific conductive mesa, $R_{sm1}$ represents a semiconductor substrate sheet resistance within a portion said corresponding specific additional space aligned below said corresponding specific conductive mesa, $R_{sm2}$ represents a conductive mesa sheet resistance associated with said corresponding specific conductive mesa, and $\rho_{c1}$ represents a semiconductor substrate to conductive mesa interface resistance associated with said corresponding specific conductive mesa.

19. The method of claim 18, said extracting of said second set of resistance parameters associated with said second transmission line model structure comprising using said second current-voltage measurements and said first set of resistance parameters of $R_T$, $R_{sb}$, $R_{mesa}$, $R_c$, $R_{sm1}$, $R_{sm2}$ and $\rho_{c1}$ to solve for $R_{sm3}$ and $\rho_{c2}$ in the following second resistance expressions:

$$R_{mesa} = \frac{2R_{sm1}^2}{\rho_{c1}(A^2-B^2)W}\left\{\frac{1}{A}\left[1 - \frac{\rho_{c1}B^2(R_{sm2}+R_{sm3})R_{seq}}{R_{sm1}R_{sm2}R_{sm3}}\right]\tanh\left(\frac{L_m}{2L_{T1}}\right) - \frac{1}{B}\left[1 - \frac{\rho_{c1}A^2(R_{sm2}+R_{sm3})R_{seq}}{R_{sm1}R_{sm2}R_{sm3}}\right]\tanh\left(\frac{L_m}{2L_{T2}}\right)\right\} + R_{seq}\frac{L_m}{W},$$

$$R_{seq} = \frac{R_{sm1}R_{sm2}R_{sm3}}{R_{sm1}R_{sm2}+R_{sm2}R_{sm3}+R_{sm1}R_{sm3}},$$

$$a = \frac{R_{sm1}}{\rho_{c1}},\ b = \frac{R_{sm2}}{\rho_{c1}},\ c = \frac{R_{sm2}}{\rho_{c2}},\ d = \frac{R_{sm3}}{\rho_{c2}},$$

$$A = \sqrt{\frac{1}{2}\left(a+b+c+d+\sqrt{((a+b)-(c+d))^2+4bc}\right)},$$

and $$B = \sqrt{[a+b+c+d]-A^2},$$

where $$L_{T1} = 1/A$$

$$L_{T2} = 1/B,$$

and where $R_{sm3}$ represents a conductive layer sheet resistance associated with said conductive layer on said specific conductive mesa, $R_{seq}$ represents a total equivalent mesa sheet resistance, $L_{T2}$ represents a conductive mesa to conductive layer transfer length associated with said specific conductive mesa, and $\rho_{c2}$ represents said specific conductive mesa to conductive layer interface resistance.

20. The method of claim 13, said characterizing, by said processor, further comprising characterizing conductive mesa to conductive layer interface resistances associated with all of said conductive mesas in all of said additional spaces in said second transmission line model structure based on said first current-voltage measurements and said second current-voltage measurements such that said characterizing accounts for each of said progressively increasing third lengths.

21. A computer program product comprising a tangible computer readable storage device, said tangible computer readable storage device storing program code, said program code being executable by a computer to perform a method for characterizing resistance, said method comprising:
receiving first current-voltage measurements and second current-voltage measurements acquired from a test structure, said test structure comprising:
a semiconductor substrate;
a first transmission line model structure on said substrate; and
a second transmission line model structure on said substrate,
said first transmission line model structure and said second transmission line model structure each comprising:
a row of contact pads comprising an initial contact pad and a group of additional contact pads adjacent to said initial contact pad, said initial contact pad being separated from said group by an initial space having a first length and pairs of additional contacts being separated by additional spaces having progressively increasing second lengths that are greater than said first length; and
conductive mesas centered within said additional spaces and having progressively increasing third lengths,
said second transmission line model structure only further comprising a conductive layer on a top surface of each of said conductive mesas, and
said first current-voltage measurements being acquired by a probing station from said row of contact pads in said first transmission line model structure and said second current-voltage measurement being acquired by said probing station from said row of contact pads in said second transmission line model structure; and characterizing a specific conductive mesa to conductive layer interface resistance associated with a specific conductive mesa in a specific additional space in said second transmission line model structure based on said first current-voltage measurements and said second current-voltage measurements.

22. The computer program product of claim 21, said initial contact pad and said additional contact pads in said row of contact pads being identical.

23. The computer program product of claim 21, said conductive mesas each comprising at least one of the following:
   a silicide layer;
   a doped semiconductor layer;
   a metal layer;
   a metal alloy layer; and
   a doped raised portion of said substrate.

24. The computer program product of claim 21, said conductive layer comprising any one a single silicide layer, a single doped semiconductor layer, a single metal layer and a single metal alloy layer.

25. The computer program product of claim 21, said characterizing of said specific conductive mesa to conductive layer interface resistance comprising:
   extracting a first set of resistance parameters associated with said first transmission line model structure based on said first current-voltage measurements; and
   extracting a second set of resistance parameters associated with said second transmission line model structure based on said second current-voltage measurements and said first set of resistance parameters, said second set of resistance parameters comprising at least said specific conductive mesa to conductive layer interface resistance.

* * * * *